United States Patent
Paik

(10) Patent No.: US 7,517,562 B2
(45) Date of Patent: Apr. 14, 2009

(54) DEPOSITION METHOD USING A UNIFORM ELECTRIC FIELD

(75) Inventor: Young Hun Paik, Kyoungsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 288 days.

(21) Appl. No.: 11/477,387

(22) Filed: Jun. 30, 2006

(65) Prior Publication Data

US 2007/0014932 A1    Jan. 18, 2007

Related U.S. Application Data

(63) Continuation of application No. 10/144,806, filed on May 15, 2002, now Pat. No. 7,081,165.

(30) Foreign Application Priority Data

May 18, 2001    (KR) .................... 10-2001-27128

(51) Int. Cl.
*B05D 1/04* (2006.01)
(52) U.S. Cl. .............. 427/458; 427/533; 427/248.1
(58) Field of Classification Search ........... 427/458, 427/533, 248.1
See application file for complete search history.

(56) References Cited

U.S. PATENT DOCUMENTS

| | | | |
|---|---|---|---|
| 4,741,801 A * | 5/1988 | Coleman ................ 438/96 |
| 5,459,632 A * | 10/1995 | Birang et al. ............. 361/234 |
| 5,464,499 A * | 11/1995 | Moslehi et al. ........... 438/729 |
| 5,474,640 A | 12/1995 | Ye et al. .............. 156/345.43 |
| 5,557,215 A | 9/1996 | Saeki et al. ............... 324/765 |
| 5,665,167 A | 9/1997 | Deguchi et al. ........... 118/728 |
| 5,858,100 A | 1/1999 | Maeda et al. ............. 118/719 |
| 5,900,062 A | 5/1999 | Loewenhardt et al. .. 118/723 R |
| 6,001,175 A * | 12/1999 | Maruyama et al. ......... 117/102 |
| 6,106,631 A | 8/2000 | Inoue et al. ............... 118/729 |
| 6,120,609 A | 9/2000 | Selyutin et al. ............ 118/728 |
| 6,270,859 B2 * | 8/2001 | Zhao et al. ............... 427/535 |
| 6,342,755 B1 * | 1/2002 | Russ et al. ................ 313/310 |
| 6,902,658 B2 * | 6/2005 | Talin et al. ............... 204/484 |

(Continued)

FOREIGN PATENT DOCUMENTS

JP    05243364    9/1993

(Continued)

OTHER PUBLICATIONS

Tabuchi, Toshihiro et al., "Hollow electrode enhanced RF glow plasma for the fast deposition of microcrystalline silicon". Surface and Coatings Technology, vol. 173, Issues 2-3, Aug. 22, 2003, pp. 243-248.*

*Primary Examiner*—Bret Chen
(74) *Attorney, Agent, or Firm*—Morgan Lewis & Bockius LLP

(57) ABSTRACT

A deposition method includes placing a substrate on a susceptor inside a chamber, the susceptor including a center pin passing through the susceptor for lifting the substrate, energizing an electrode to applying a uniform electric field to the substrate, electrically connecting a ground member extending along and attached to an entire axial length of the center pin to a ground voltage source, and forming a film on the substrate by chemical vapor deposition.

12 Claims, 13 Drawing Sheets

U.S. PATENT DOCUMENTS

2003/0002002 A1* 1/2003 Kawachi et al. ............. 349/143
2003/0132898 A1* 7/2003 Akiba ..................... 345/63

FOREIGN PATENT DOCUMENTS

| JP | 06112303 A | 4/1994 |
| JP | 06326177 A | 11/1994 |
| JP | 06338463 A | 12/1994 |
| JP | 07074231 A | 3/1995 |
| JP | 10229118 A | 8/1998 |
| JP | 11340309 A | 12/1999 |

* cited by examiner

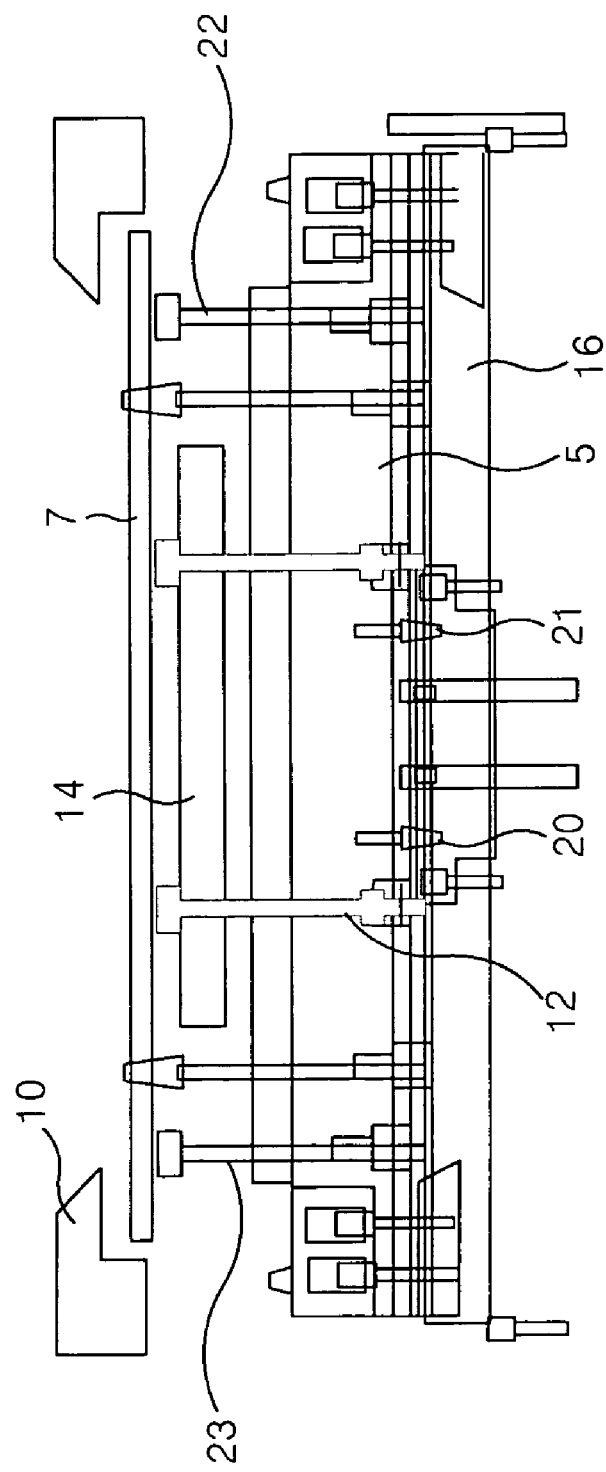

DEPOSITION METHOD USING A UNIFORM ELECTRIC FIELD

The present application is a Continuation of U.S. patent application Ser. No. 10/144,806 filed May 15, 2002, now U.S. Pat. No. 7,081,165 issued Jul. 25, 2006, which claims the benefit of Korean Patent Application No. P2001-27128 filed in Korea on May 18, 2001, both of which are incorporated herein by reference.

BACKGROUND OF THE INVENTION

1. Field of the Invention

The present invention relates to a chemical vapor deposition apparatus, and more particularly to a chemical vapor deposition apparatus for creating a uniform electric field.

2. Description of the Related Art

In general, a liquid crystal display (LCD) controls a light transmittance of liquid crystal cells that are arranged in a matrix array on a liquid crystal display panel. Accordingly, the liquid crystal cells receive data signals, thereby displaying an image (picture). The LCD includes electrodes for supplying an electric field to a liquid crystal layer, a thin film transistor (TFT) for switching the data signals provided to the liquid crystal cells, a lower substrate having signal wiring for supplying the data signals to the liquid crystal cells and signal wiring for supplying control signals of the TFT, an upper substrate having a color filter, a spacer formed between the upper substrate and the lower substrate for providing a predetermined cell gap, and liquid crystal molecules disposed within a space provided between the upper substrate and the lower substrate.

During fabrication of the liquid crystal display device, a channel portion in an active layer of the TFT and a protective layer protecting the TFT are formed during plasma enhanced chemical vapor deposition (PECVD) processing. During PECVD processing, a gas is injected into a vacuum chamber. Then, at a specific pressure and substrate temperature, the injected gas decomposes into a plasma by use of a radio frequency (RF) voltage, thereby depositing materials onto a surface of the substrate. A quality of the deposited material is dependent upon the deposition conditions, such as the vacuum, the RF voltage, the RF voltage frequency, substrate temperature, reaction gas, and reaction pressure, for example. In addition, the deposited materials includes insulating films, semiconductor films, gate insulating films, protective films, and etch stopper films. The semiconductor films include amorphous silicon (a-Si:H) that form an active layer, and doped amorphous silicon (n+a-Si:H) that form a contact protective layer.

FIG. 1 is a cross sectional view of a plasma enhanced chemical vapor deposition (PECVD) apparatus according to a related art. In FIG. 1, the PECVD apparatus includes a gas jet 9 for releasing a gas to be deposited onto a substrate 7, and a chamber 1. The chamber 1 includes a susceptor 5 for applying heat via a heating coil to the substrate 7, an arrow pin 10 for securing the substrate 7, and a center pin 12 for separating the susceptor 5 from the substrate 7.

During processing, the substrate 7 is placed upon the susceptor 5 within the chamber 1, and the susceptor 5 applies heat to the substrate 7 and functions as a lower electrode for generating a plasma. A temperature of the susceptor 5 averages about 370° C. In addition, the susceptor 5 includes various pins formed to penetrate the susceptor 5.

The arrow pin 10 secures the substrate 7 within the chamber 1, and the center pin 12 rises by a pin plate 16 to prevent any drooping of the substrate 7. In addition, the center pin and pin plate 16 prevents formation of any scratches between a robot arm 14 and the substrate 7 during loading and unloading of the substrate 7. The pin plate 16 includes a center pin-supporting portion 18 having the center pin 12 passing through it.

FIGS. 2A to 2D show a process for loading a substrate into a chamber according to the related art.

In FIG. 2A, the substrate 7 is loaded into the chamber 1 by the robot arm 14, and the substrate 7, the susceptor 5, and the center pin 12 are not mutually contacting each other.

In FIG. 2B, the pin plate 16 rises to mount the center pin-supporting portion 18 in center pin mount portions 20 and 21 equipped on a rear surface of the susceptor 5, and each of corner pins 22 and 23 and the center pin 12 rise by a power driver (not shown) to lift the substrate 7.

In FIG. 2C, the robot arm 14 is separated from the substrate 7 by the power driver (not shown).

In FIG. 2D, the susceptor 5 rises by a susceptor-lifting portion 24 to make the susceptor 5 lift the substrate 7 and the center pin 12. Then, the susceptor 5 raises the substrate 7 close to the arrow pin 10. Accordingly, the substrate 7 is safely placed into a deposition position.

FIG. 3 is a cross sectional view representing an inside of a chamber according to the related art. In FIG. 3, the chamber 1 includes the substrate 7 safely placed upon the susceptor 5, and an upper electrode 30 that faces the substrate 7 with a predetermined gap therebetween. The center pin 12 raises the substrate 7 upon loading, and the susceptor 5 rises. Accordingly, the substrate 7 sustains a predetermined gap from the upper electrode 30, and the center pin 12 lowers into a center pin hole 19 formed on the susceptor 5. The center pin 12 is made of ceramic material that has a low coefficient of thermal expansion.

FIG. 4 is a cross sectional view of a center pin according to the related art as shown in FIG. 3. In FIG. 4, an insulating film $Al_2O_3$ is formed upon a head portion 3 of the center pin 12, thereby preventing electrical arcing during plasma processing. Accordingly, the center pin 12 is not ground to the susceptor 5. However, the heating coil (not shown) formed inside the susceptor 5 is ground with an external ground voltage source GND.

In FIG. 3, a radio frequency (RF) voltage source 32 is connected to the upper electrode 30. Accordingly, an electric field is generated between the upper electrode 30 and the substrate 7, whereby an insulating film or a semiconductor film is deposited upon a surface of the substrate 7. When depositing the insulating film or the semiconductor film on the substrate 7, the electric field emanating from the upper electrode 30 is bowed in a region of the center pin 12. Accordingly, an electric field density in a region of the center pin 12 is relatively low, thereby a thickness of the deposition film in the region of the center pin 12 will be thinner than surrounding regions.

FIG. 5 shows a defect resulting from the center pin according to the related art. In FIG. 5, a thickness of the deposition film in an area A of the substrate 7, which corresponds to a region of the center pin 12 (in FIG. 3), is different from a thickness of the deposition film in other regions.

FIG. 6 is a spectrum photograph showing the defect on a substrate illustrated in FIG. 5 according to the related art. In FIG. 6, the thickness of the deposition film in the area A of the substrate 7, which corresponds to the region of the center pin 12 (in FIG. 3), is relatively thinner than the thickness of the deposition film in the other regions.

FIG. 7 is a graph showing thickness distribution of a deposition film of the substrate 7 (in FIG. 5) taken along I-I' of FIG. 6. In FIG. 7, the graphical distribution of deposition thickness of the deposition film on the substrate indicates that a defect is generated in a region corresponding to the center pin 12 (in FIG. 3). Accordingly, the defect degrades image quality of the liquid crystal display device.

SUMMARY OF THE INVENTION

Accordingly, the present invention is directed to a chemical vapor deposition apparatus and method of using the same that substantially obviates one or more of the problems due to limitations and disadvantages of the related art.

An object of the present invention is to provide a chemical vapor deposition apparatus and method of using the same to generate a uniform electric field, thereby forming a deposition film having a uniform thickness.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a chemical vapor deposition method includes placing a substrate on a susceptor inside a chamber, the susceptor including a center pin passing through the susceptor for lifting the substrate, energizing an electrode to applying a uniform electric field to the substrate, electrically connecting a ground member extending along and attached to an entire axial length of the center pin to a ground voltage source, and forming a film on the substrate by chemical vapor deposition.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 2A to 2D show a process for loading a substrate into a chamber according to the related art;

DETAILED DESCRIPTION OF THE PREFERRED EMBODIMENTS

Reference will now be made in detail to the preferred embodiments of the present invention, examples of which are illustrated in the accompanying drawings.

Figure 1:
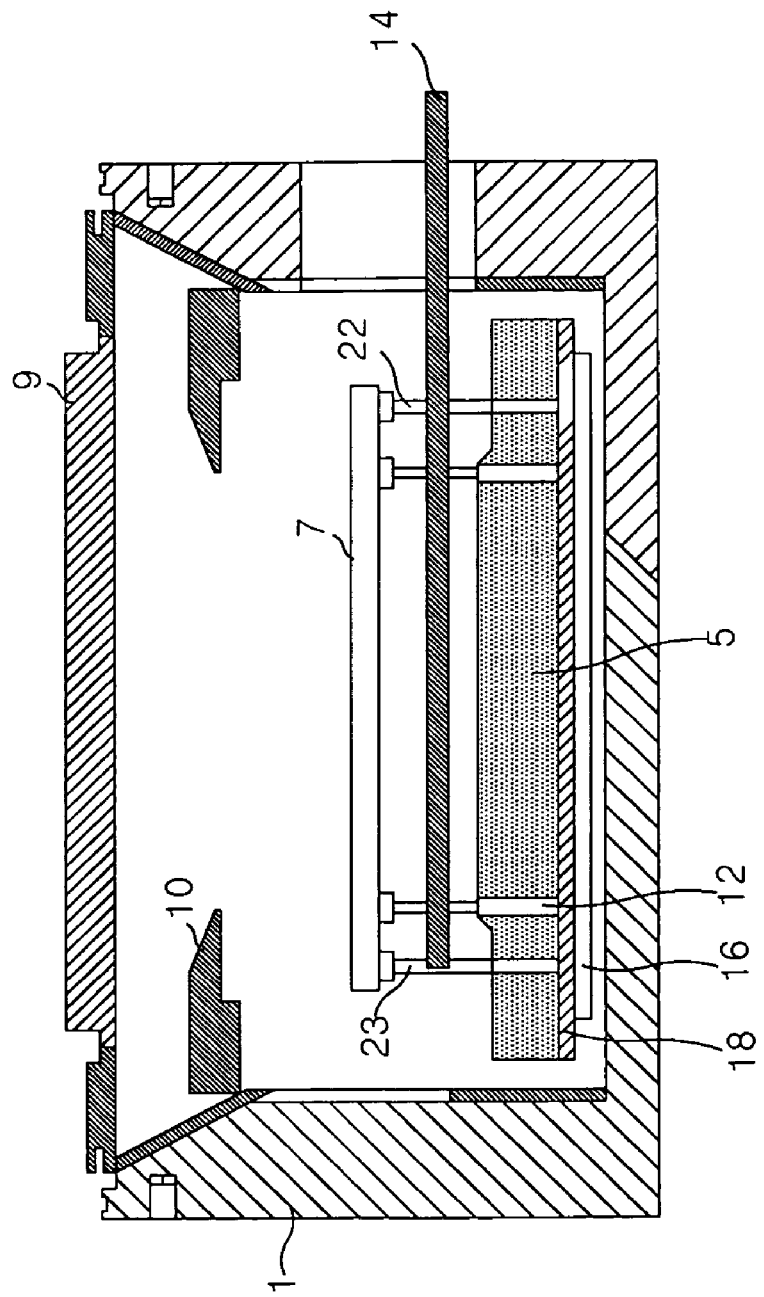
FIG. 1 is a cross sectional view of a chemical vapor deposition apparatus according to a related art.
Figure 2A:
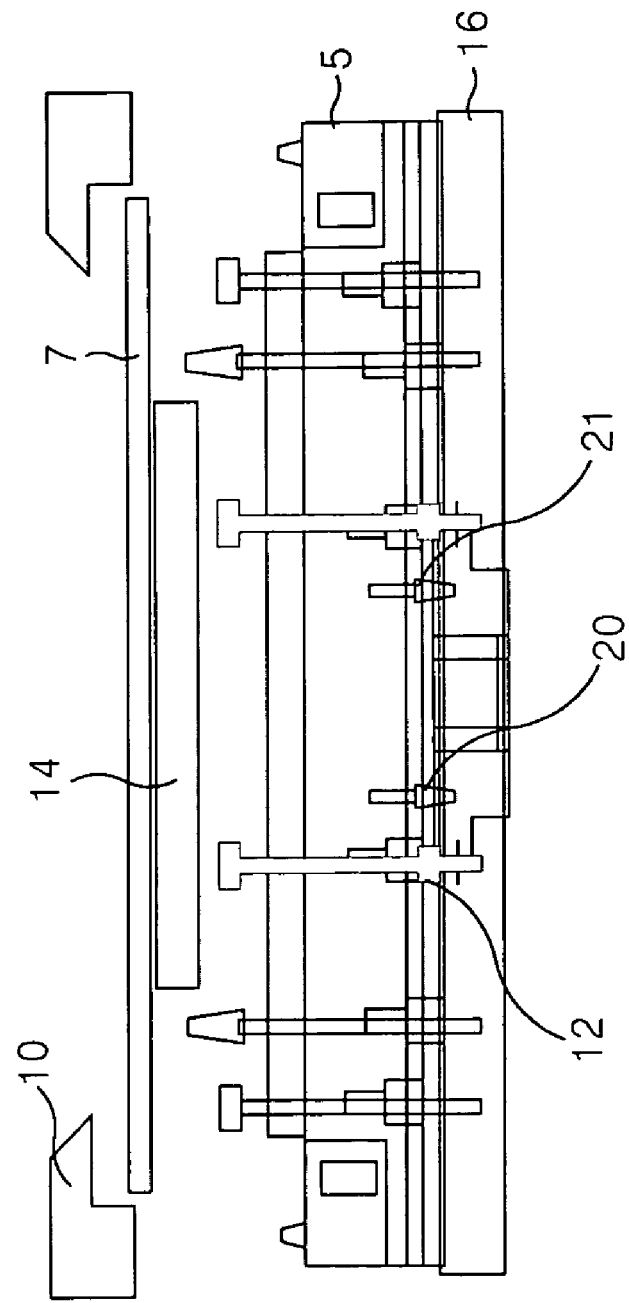
Figure 2C:
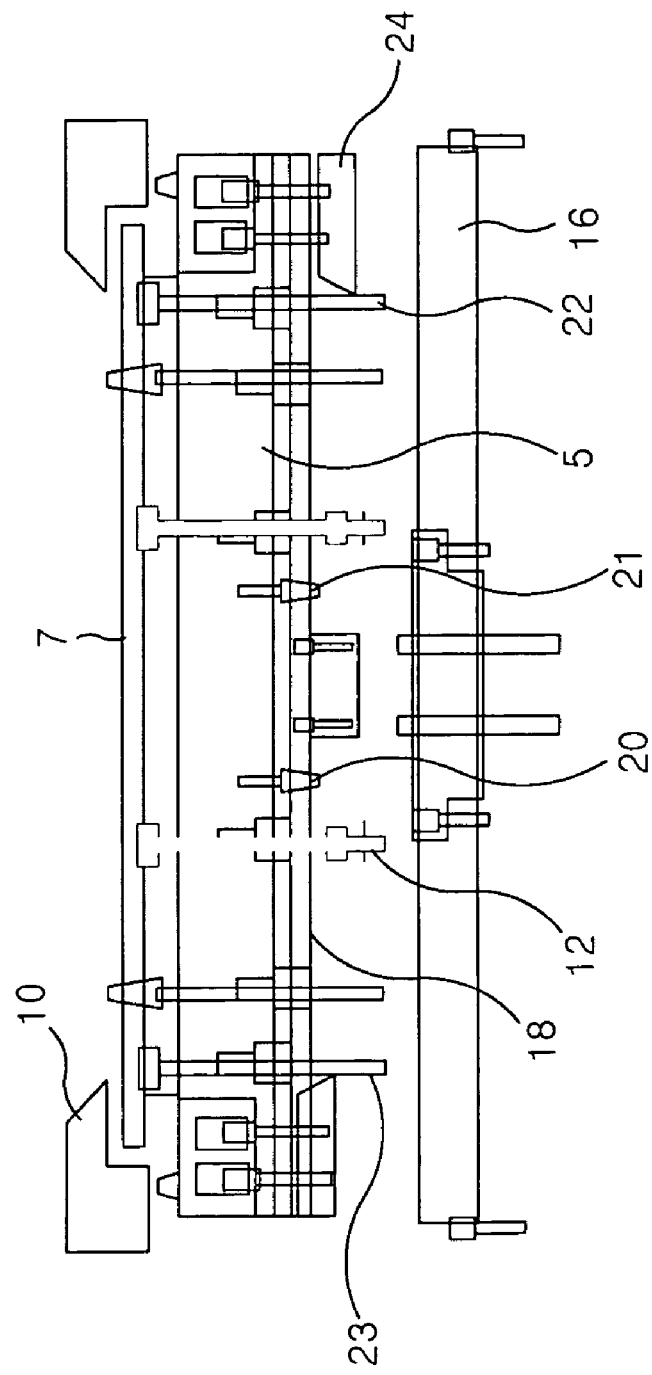
Figure 2D:
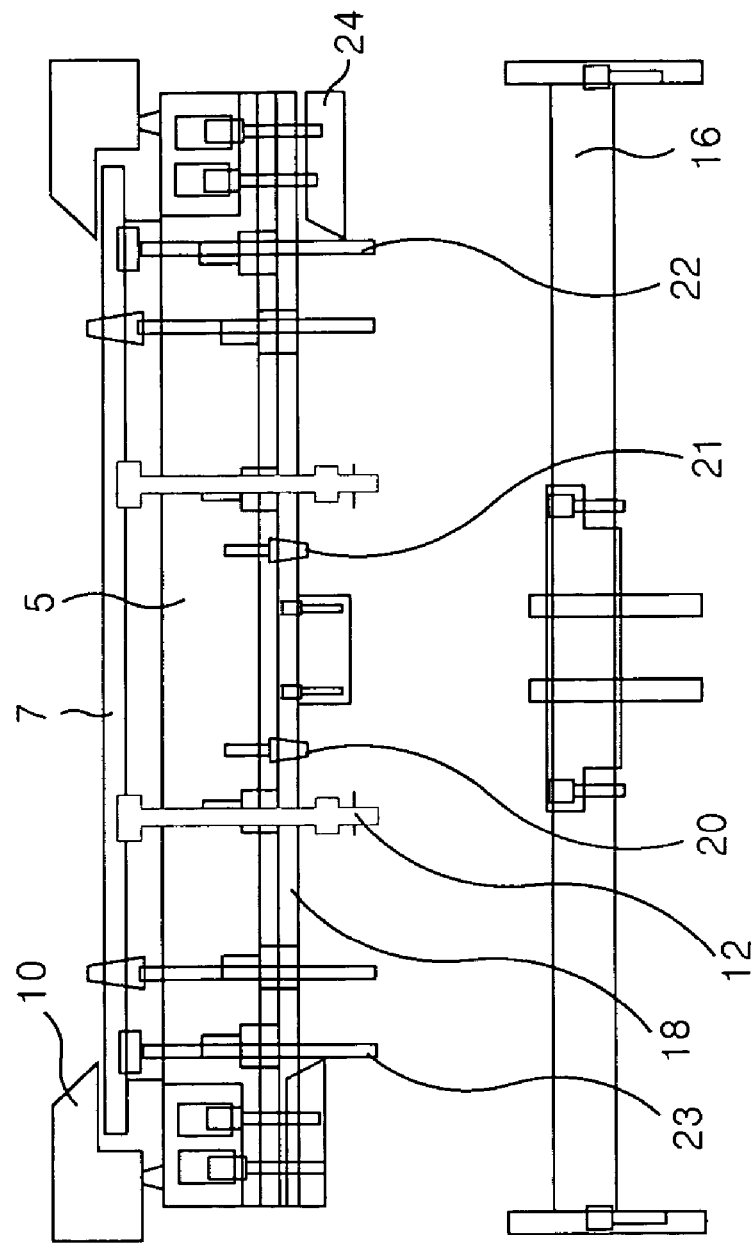
Figure 3:
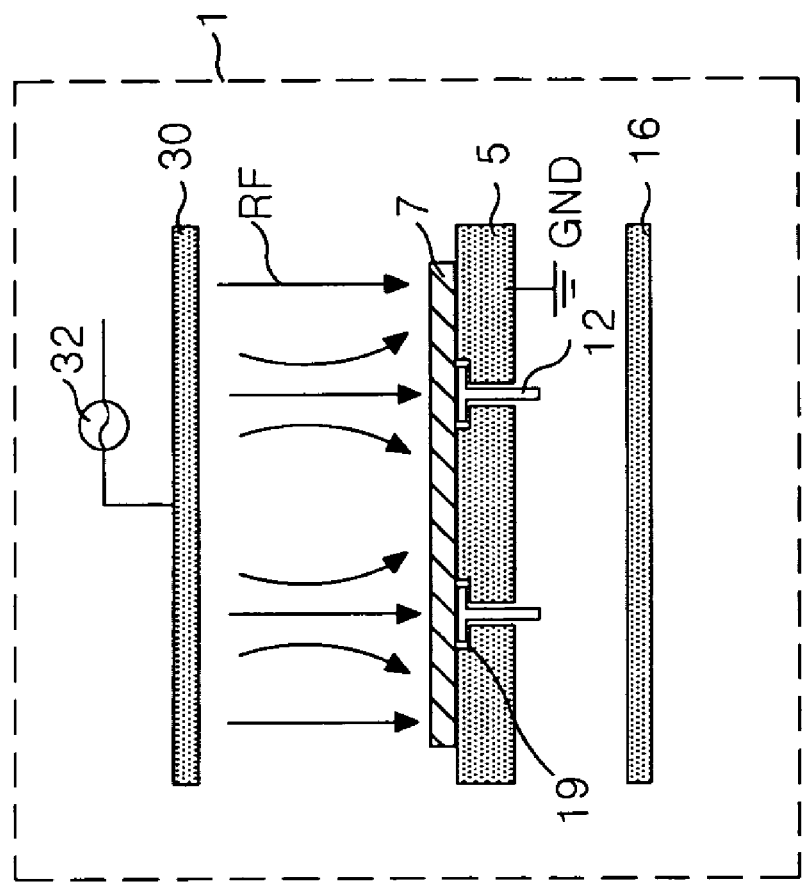
FIG. 3 is a cross sectional view of an inside of a chamber according to the related art.
Figure 4:
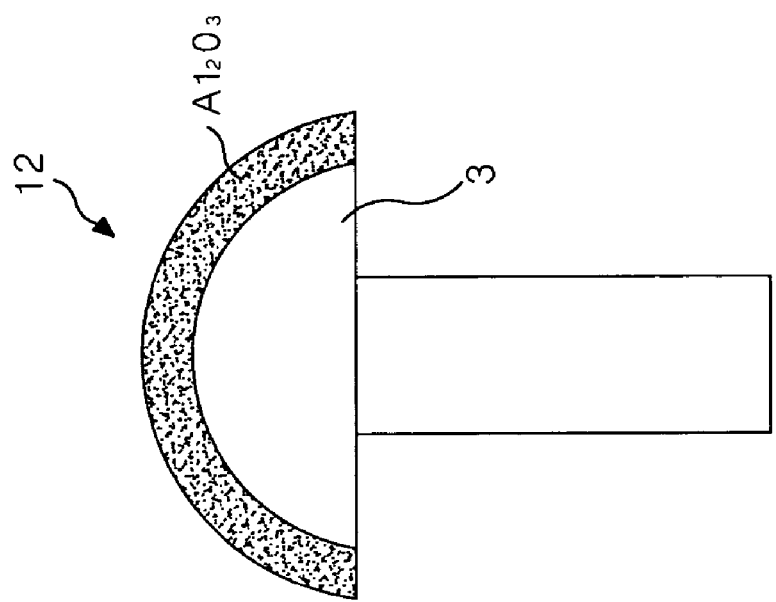
FIG. 4 is a cross sectional view of a center pin according to the related art, as shown in FIG. 3.
Figure 5:
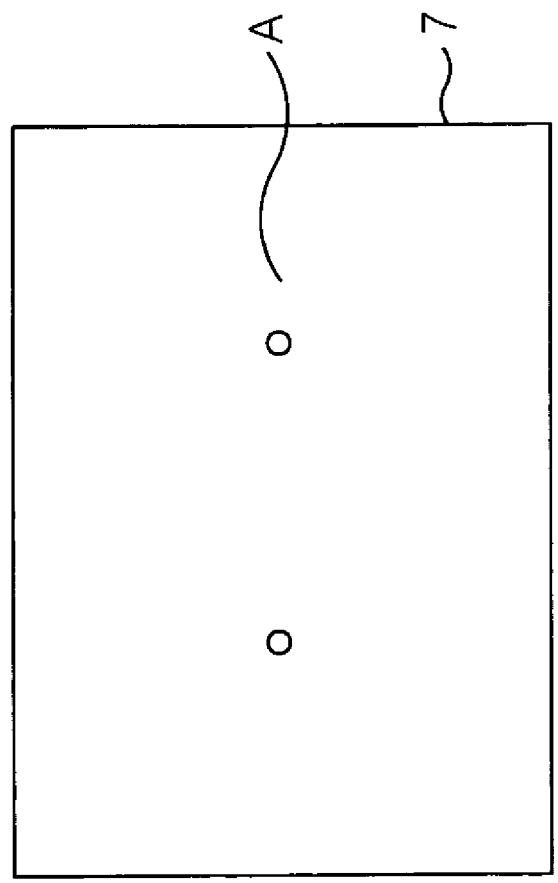
FIG. 5 shows a defect resulting from the center pin according to the related art.
Figure 6:
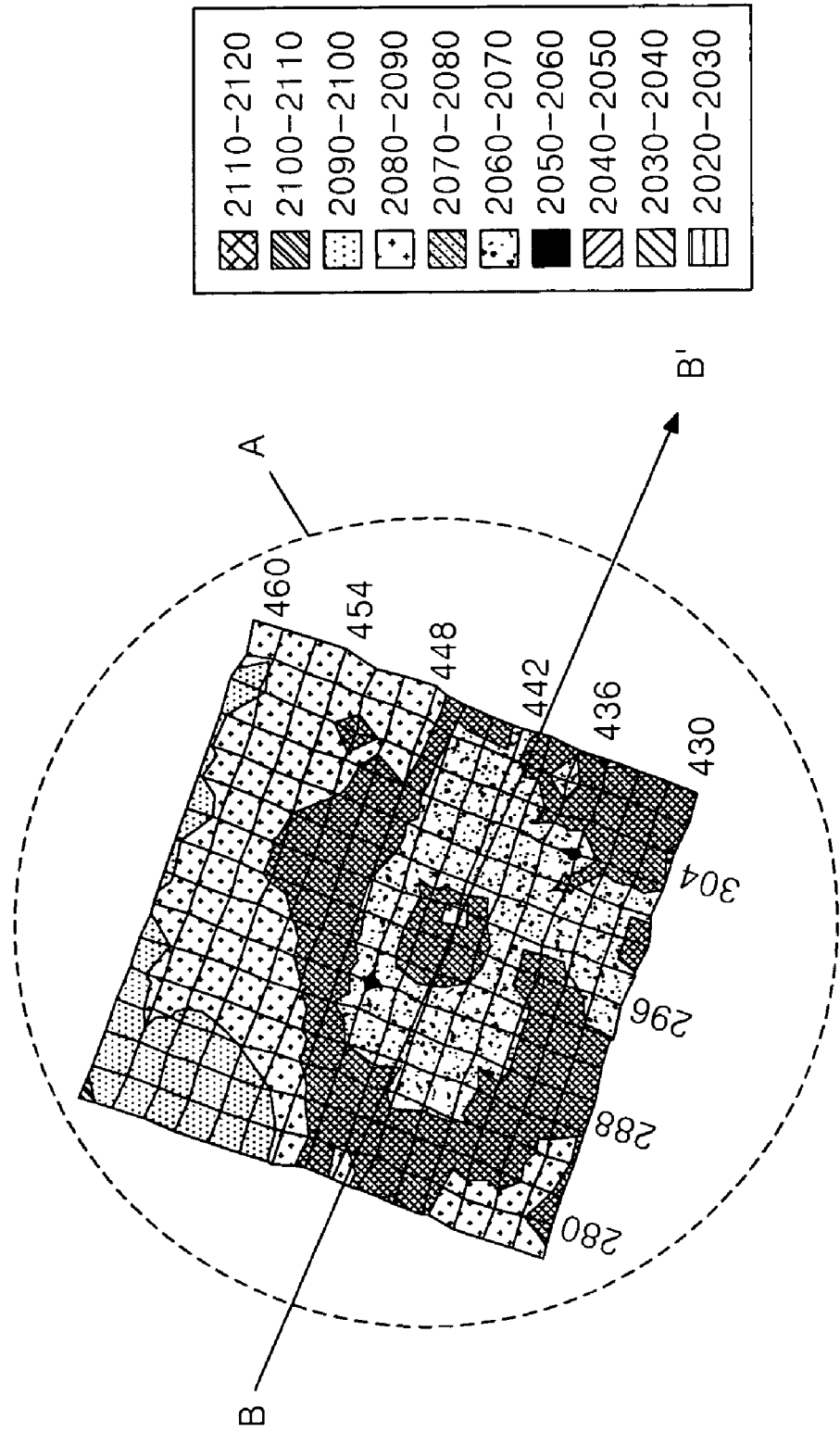
FIG. 6 is a spectrum photograph showing the defect on a substrate illustrated in FIG. 5 according to the related art.
Figure 7:
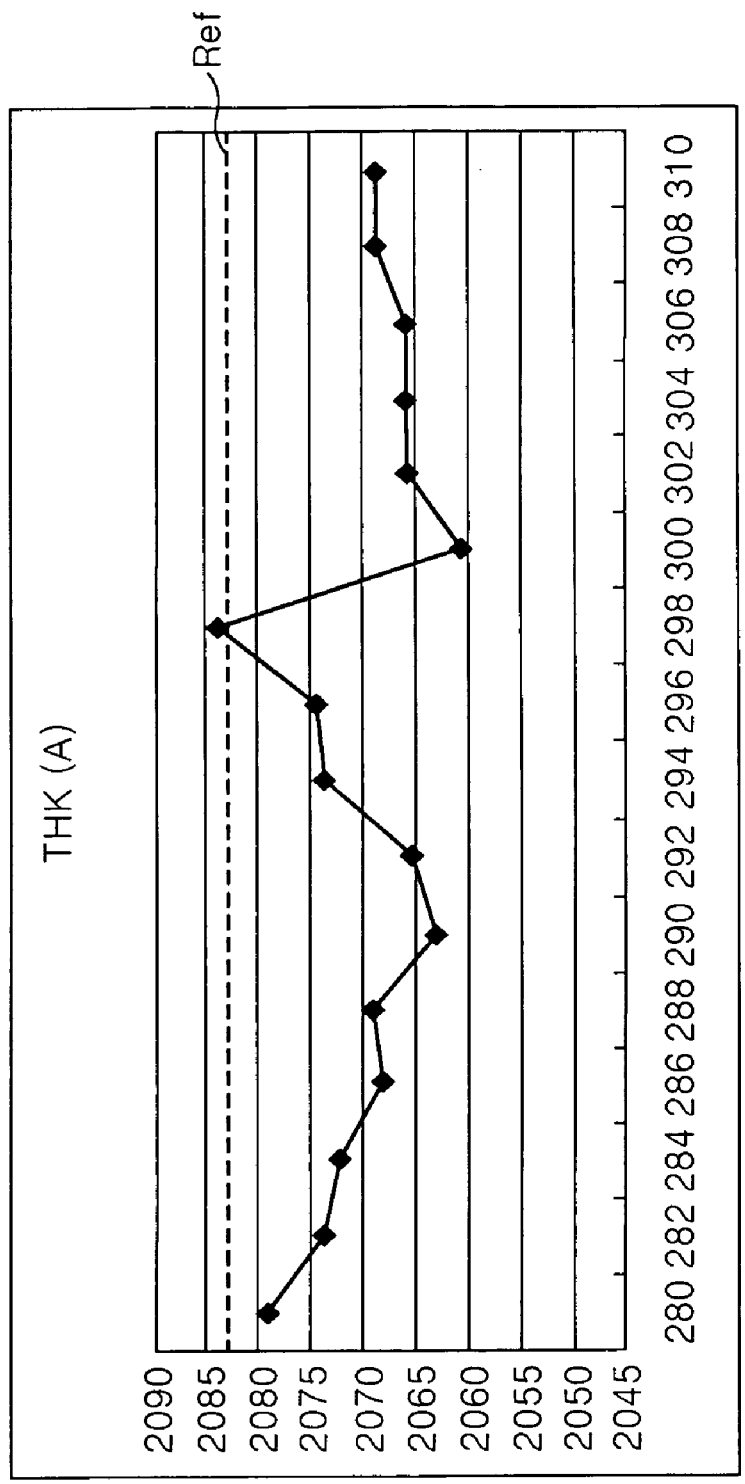
FIG. 7 is a graph showing thickness distribution of a deposition film of the substrate taken along I-I' of FIG. 6.
Figure 8:
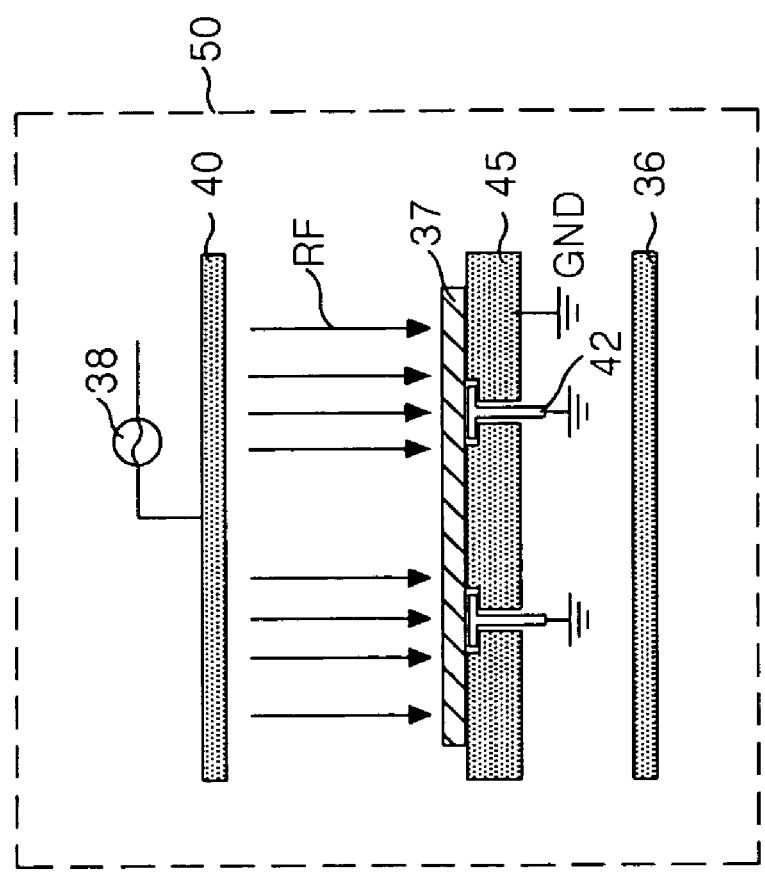
FIG. 8 is a cross sectional view showing an exemplary chamber according to the present invention.

FIG. 8 is a cross sectional view showing an exemplary chamber according to the present invention. In FIG. 8, a chemical vapor deposition apparatus may include a chamber 50 for performing a deposition process on a substrate 37. The chamber 50 may include a susceptor 45 contacting the substrate 37, a center pin 42 for lifting the substrate 37, and an upper electrode 40 facing the substrate 37 and having a predetermined gap therebetween for generating an electric field.

The substrate 37 may be placed onto the susceptor 45 within the chamber 50. A heating coil (not shown) may be formed within the susceptor 45 to supply heat to the substrate 37. The susceptor 45 may also function as a lower electrode for generating a plasma discharge. During the deposition process, a temperature within the susceptor 45 may average about 370° C. The susceptor 45 may include various pins (not shown) that pass through the susceptor 45 for chemical vapor deposition.

The center pin 42 may be elevated by means of a pin plate 36 to prevent any drooping of the substrate 37. The pin plate 36 prevents any of the substrate 37 by a robot arm (not shown) during loading and unloading of the substrate 37. In addition, the pin plate 36 functions to raise the center pin 42 via a power driver (not shown).

Figure 9:
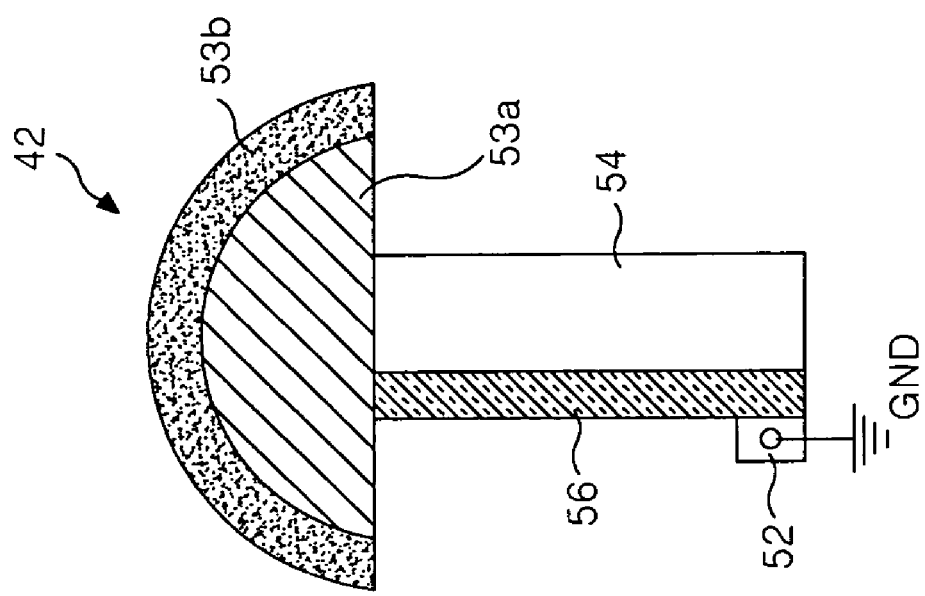
FIG. 9 is a cross sectional view of an exemplary center pin according to the present invention.

FIG. 9 is a cross sectional view of an exemplary center pin according to the present invention. In FIG. 9, the center pin 42 may include a head portion 53, a head supporter 54, and a grounding terminal 52. The head portion 53 may include a conductive segment 53a formed of aluminum (Al), for example, and an insulating segment 53b such as aluminum oxide ($Al_2O_3$), for example. The insulating segment 53b may prevent electrical arcing between the substrate 37 and the susceptor 45 when the electrical field is applied between the susceptor 45 and the upper electrode 40 (in FIG. 8).

The head supporter 54 may be formed of a ceramic material, for example, having a low coefficient of thermal expansion. A ground line 56 may be formed at one side of the head supporter 54. The ground line 56 may be formed of an electrically conductive metal such as aluminum (Al), for example, inserted into a groove formed at one side of the head supporter 54 and electrically interconnected to the conductive segment 53a of the head portion 53.

The ground terminal 52 may be electrically connected to the conductive segment 53a of the head portion 53 via the ground line 56, thereby grounding the center pin 42 to an external ground voltage source GND. The grounding the center pin 42 may be accomplished by electrically connecting a lower part of the center pin 42 to the ground terminal 52 after removing a portion of the ground terminal 52 that has been coated with the insulating segment 43b. Then, the ground terminal 52 may be connected to a metal line that extends from a lower part of the susceptor 45, thereby electrically grounding the center pin 42 to the external ground voltage source GND.

In FIG. 8, the upper electrode 40 may receive a voltage from a radio frequency voltage source 38 to form a deposition film on the substrate 37. Accordingly, since the center pin 42 is grounded to the ground voltage source GND via the ground line 56, a uniform electric field is generated between the susceptor 45 and the upper electrode 40. This uniform electric field results in a deposition film have a uniform thickness across a surface of the substrate 37, and prevents formation of any defects within a region of the center pin 42.

Figure 10:
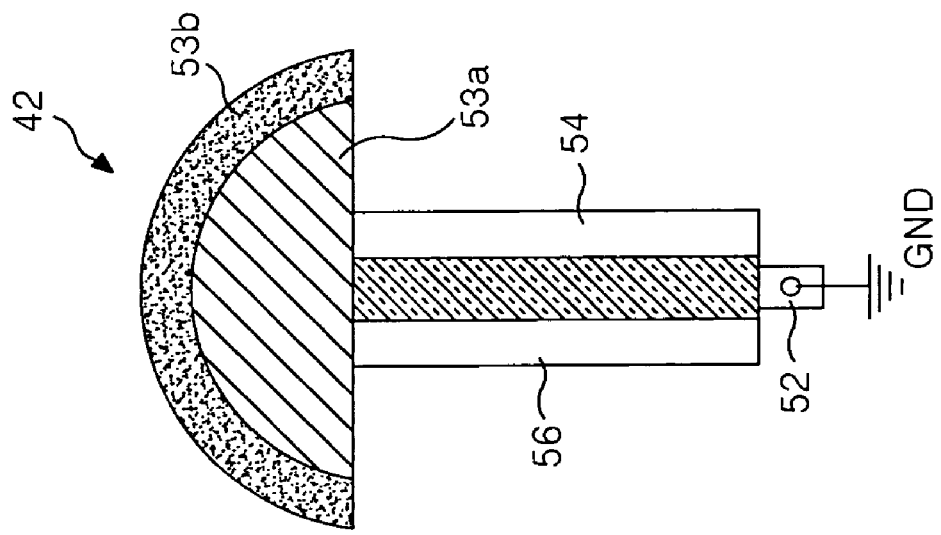
FIG. 10 is a cross sectional view of another exemplary center pin according to the present invention.

FIG. 10 is a cross sectional view of another exemplary center pin according to the present invention. In FIG. 10, the center pin 42 may include a head portion 53, a head supporter 54, and a grounding terminal 52. The head portion 53 may include a conductive segment 53a formed of aluminum (Al), for example, and an insulating segment 53b such as aluminum oxide ($Al_2O_3$). The insulating segment 53b may prevent electrical arcing between the substrate 37 and the susceptor 45 when the electrical field is applied between the susceptor 45 and the upper electrode 40 (in FIG. 8).

The head supporter 54 may be formed of a ceramic material, for example, having a low coefficient of thermal expansion. A ground line 56 may be formed passing through a center part of the head supporter 54, and may be formed of an electrically conductive metal, for example, and may electrically interconnect the conductive segment 53a of the head portion 53 to an external ground voltage source GND via the grounding terminal 52.

The ground terminal 52 may be electrically connected to the conductive segment 53a of the head portion 53 via the ground line 56, thereby grounding the center pin 42 to an external ground voltage source GND. The grounding the center pin 42 may be accomplished by electrically connecting a lower part of the center pin 42 to the ground terminal 52 after removing a portion of the ground terminal 52 that has been coated with the insulating segment 43b. Then, the ground terminal 52 may be connected to a metal line that extends from a lower part of the susceptor 45, thereby electrically grounding the center pin 42 to the external ground voltage source GND.

In FIG. 8, the upper electrode 40 may receive a voltage from a radio frequency voltage source 38 to form a deposition film on the substrate 37. Accordingly, since the center pin 42 is grounded to the ground voltage source GND via the ground line 56, a uniform electric field is generated between the susceptor 45 and the upper electrode 40. This uniform electric field results in a deposition film have a uniform thickness across a surface of the substrate 37, and prevents formation of any defects within a region of the center pin 42.

It will be apparent to those skilled in the art that various modifications and variations can be made in the chemical vapor deposition apparatus of the present invention without departing from the spirit or scope of the invention. Thus, it is intended that the present invention cover the modifications and variations of this invention provided they come within the scope of the appended claims and their equivalents.

What is claimed is:

1. A deposition method, comprising the steps of:
   placing a substrate on a susceptor inside a chamber, the susceptor including a center pin passing through the susceptor for lifting the substrate up and down;
   applying a first voltage source to the susceptor;
   electrically connecting a connection member extending along and attached to an entire axial length of the center pin to the first voltage source;
   applying a second voltage source to a counter electrode to generate a uniform electric field between the counter electrode and the substrate; and
   forming a film on the substrate by chemical vapor deposition.

2. The method according to claim 1, wherein placing of the substrate includes positioning the substrate in contact with a head portion of the center pin, the head portion being supported by a head supporter.

3. The method according to claim 2, wherein the connection member is formed between the head portion and the head supporter.

4. The method according to claim 2, wherein the connection member passes through a center portion of the head supporter.

5. The method according to claim 2, wherein the connection member is formed along one side of the head supporter.

6. The method according to claim 2, wherein the head portion includes aluminum.

7. The method according to claim 2, wherein the head supporter includes a ceramic material.

8. The method according to claim 2, wherein the head portion is formed with a conductive material, and the head supporter is formed with a material having a low coefficient of thermal expansion.

9. The method according to claim 2, wherein the head portion is coated with an insulating material.

10. The method according to claim 1, wherein the connection member includes an electrically conductive metal.

11. The method according to claim 1, further comprising heating the substrate.

12. The method according to claim 11, wherein heating the substrate includes energizing a heating coil within the susceptor.

* * * * *